Feb. 25, 1969 D. B. MARSH ET AL 3,430,066
UNIT GAIN FAIL-SAFE "AND" LOGIC CIRCUIT
Filed Aug. 31, 1965
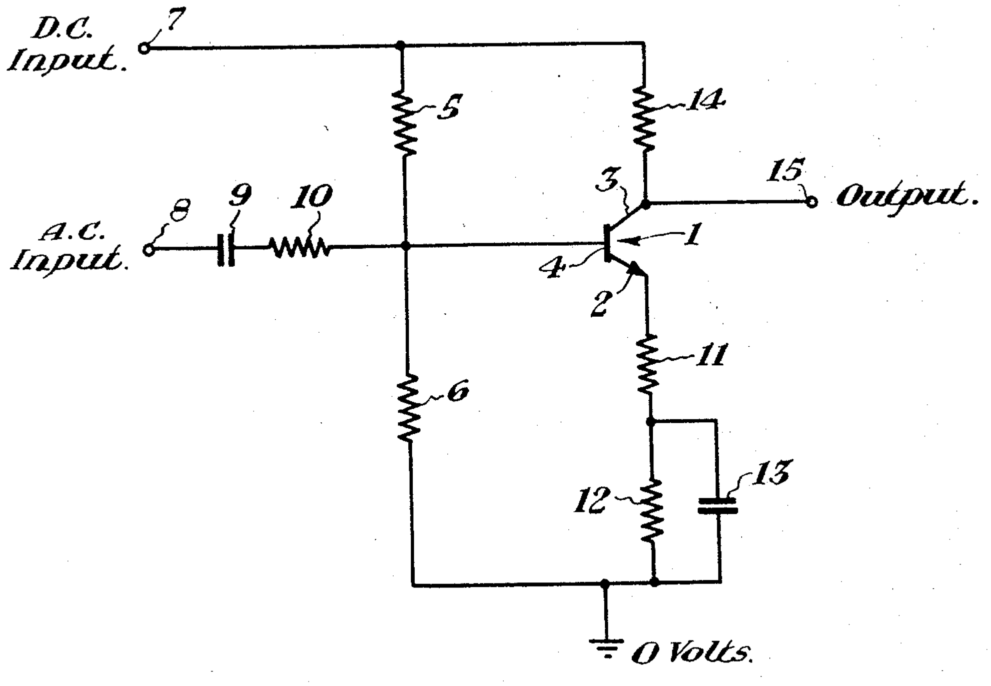
INVENTORS
Donald B. Marsh and
Walter W. Sanville.
BY W. L. Stout
THEIR ATTORNEY United States Patent Office 3,430,066

Patented Feb. 25, 1969

3,430,066

UNIT GAIN FAIL-SAFE "AND" LOGIC CIRCUIT

Donald B. Marsh, Wilkinsburg, and Walter W. Sanville, Eastmont, Pa., assignors to Westinghouse Air Brake Company, Swissvale, Pa., a corporation of Pennsylvania Filed Aug. 31, 1965, Ser. No. 483,953

U.S. Cl. 307—218 12 Claims

Int. Cl. H03k 19/22, 19/30

ABSTRACT OF THE DISCLOSURE

This disclosure relates to a fail-safe logic circuit which includes an A.C. amplifier having a predetermined gain factor. A biasing network interconnects a D.C. input to the amplifier and biases the amplifier for linear operation. An attenuating network interconnects an A.C. input to the amplifier and reduces the A.C. input by an amount equal to the amplifier gain factor so that the circuit operates as a unity gain device with both inputs present. Accordingly, an A.C. output is produced by the circuit and this output is designated as a logical assertion. During the absence of either input or during a period of malfunction no output is produced by the circuit and this is designated as a logical negation. The circuit is fail-safe in that an assertion can only be produced by the presence of both inputs and in the absence of a malfunction.

Our invention relates to logic circuits and more particularly to a static "AND" gate employing an A.C. linear amplifier arrangement for providing fail-safe operation.

As is well known, transistorized "AND" logic circuits are used extensively in computers as well as in other apparatus, for example, the presently disclosed logic circuit finds particular utility in a speed command decoder network of an automatic vehicle speed control system. In speed control systems of this type, it is of vital and utmost importance, and in many cases an authoritative requirement, to ensure that certain portions or sections of the system be fail-safe, that is, in case of any malfunction or probable component failure, the most restrictive type of condition must prevail.

While numerous static "AND" logic circuit arrangements are well known in the art, as a rule these conventional logic circuits are possessed of disadvantages which make their direct application in a vehicle speed control system generally unacceptable and intolerable. For example, these conventional "AND" circuits operate on a saturation-cut-off principle, that is, when all the inputs are applied simultaneously, a first prescribed output condition exists, in other words, the transistor may be said to be saturated, and therefore, producing an output signal, by convention a zero voltage 0V is produced; however, when all the inputs are not applied simultaneously, that is, all the inputs are not present, a second prescribed output condition exists, in other words, it may be said that the transistor is cut-off or nonconducting and, therefore, not producing the output signal, and conventionally designated as a negative voltage —V. It is readily apparent that under such operational conditions, a saturated transistor, in general, cannot be distinguished from a short-circuited semi-conductive element since in each case zero voltage 0V output is produced. In addition, a cut-off transistor cannot, in general, be distinguished from an open-circuited semiconductive element since a negative voltage —V output is produced regardless of whether the transistor is operating properly or has failed. Clearly, such "AND" logic circuits cannot be tolerated in systems or networks which require fail-safe operation since a coincidence circuit of this type could produce either one of its normal logical functions during periods of component failure thereby developing a logical output function which is not necessarily in agreement with the actual input circuit conditions. While various attempts have been made to ensure fail-safe operation of previously known logic circuits, such endeavors usually require additional elements or components which materially increase the complexity of construction, increase the overall cost factor, and decrease the reliability of the complete circuit since the additional constitutents are themselves susceptible to failures and malfunctions.

Accordingly, it is therefore an object of the present invention to provide a new and improved "AND" logic circuit.

Another object of the present invention is to provide an improved logic circuit which operates in a fail-safe manner.

A further object of the present invention is to provide an improved logic circuit simple in construction, economical in cost, and reliable in operation.

Still another object of the present invention is to provide an improved coincidence circuit which is incapable of producing a logical assertion function during a malfunctional condition.

Yet another object of the present invention is to provide a transistorized "AND" logic circuit which can produce an assertion or true indication during normal operating periods and which cannot produce an assertion or true indication during the periods of malfunction.

Briefly, the present invention relates to an improved logic circuit employing a unique circuit arrangement and utilizing a novel principle of operation. The circuit comprises an A.C. amplifier which includes a transistor or any equivalent three-electrode semiconductive device. A biasing network interconnects a D.C. input to the transistor electrodes for biasing the amplifier for class A or linear operation. An attenuating network interconnects an A.C. input to the input electrodes of the transistor and reduces the magnitude of the A.C. input by a fixed known amount. During the presence of both the A.C. and D.C. inputs, that is, during the period when the transistor is conducting, the circuit operates as a unity gain device since the attenuating factor of the attenuating network is equal to the gain factor of the amplifier. Under this condition, which may be defined as the normal conductive state, the circuit produces an A.C. output which is a reproduction of the A.C. input and represents a logical assertion which is indicative of the least restrictive condition. During a normally nonconductive state, that is, during periods when the transistor is nonconducting, no A.C. output is produced and therefore is representative of a logical negation which is indicative of the most restrictive condition. This latter condition may be either the consequence of the absence of either of the inputs or the product of a circuit malfunction which will render the transistor nonconducting. Accordingly, under no circumstance which renders the transistor nonconducting is a logic assertion permitted to be generated.

The above objects and other attendant advantages of the present invention will become more fully evident from the following detailed description when considered in connection with the accompanying drawing wherein:

The single figure in the drawing is a schematic circuit diagram illustrating a preferred embodiment of the present invention.

The present invention has evolved with the general object of overcoming the disadvantages of the previously mentioned prior art logic circuit configurations and with the specific object of employing a fail-safe principle in logic circuits. The "AND" circuit of the present invention may be broadly considered as a signal passing gate, that is, when all the inputs are present, an output exists which may be defined as an assertion or a true indication; and when all the inputs are not present an output does not exist which may be defined as a negation or an untrue indication. As will become more readily apparent hereinafter, the former condition can only exist during a normal operating period, and under no circumstance, when a component has failed can an assertion or true indication be obtained even with all the inputs being present, so that the necessary and basic requirements for ensuring fail-safe operation are satisfied.

Referring now to the drawing, there is shown an N-P-N transistor 1 connected in a common-emitter configuration, including an emitter electrode 2, a collector electrode 3, and a base electrode 4. The base electrode 4 of transistor 1 is connected to the junction of a voltage divider formed by resistors 5 and 6. The upper point of resistor 5 is connected to terminal 7 which may be any suitable controllable source of positive D.C. potential, for example, this source may be produced by a transformer-diode detector circuit operating in a safe manner and may be controlled or gated in response to a particular command. The lower point of resistor 6 is directly connected to a point of reference potential or signal ground, which may be at a zero voltage level, as illustrated. As will be more fully described hereinafter, resistors 5 and 6 form a biasing network which ensures that the transistor operating point is on the linear portion of the dynamic transfer characteristic curve so that transistor 1 will operate linearly. Input terminal 8, which is illustrated as the A.C. input terminal and which may be connected to a suitable gated source of A.C. signals, is connected to the junction or the intermediate point of the voltage divider which is common to the base electrode 4 of transistor 1, through a series circuit formed by coupling capacitor 9 and metal film resistor 10. As will be described in further detail hereinafter, the resistors 5, 6 and 10 form an input resistive attenuating network for reducing the magnitude of the A.C. signals appearing on terminal 8. The emitter 2 of transistor 1 is connected to ground potential through series connected metal film resistor 11 and resistor 12. Resistor 12 is paralleled by a capacitor 13 which is so proportioned to bypass A.C. signals around resistor 12. Load resistor 14 interconnects the collector electrode 3 of transistor 1 to terminal 7. Output terminal 15 is directly connected to the collector electrode 3 of transistor 1.

As previously mentioned, in explaining the operation of the logic circuit, it will be assumed that the circuit elements associated with the transistor 1 have been selected to provide class A or linear operation. Further, it may be noted that the voltage gain of the amplifier is essentially determined by the ratio of the resistance value of resistor 14 over the resistance value of resistor 11. In the present instance, the magnitudes of resistors 14 and 11 are chosen or so proportioned to provide an amplification factor of ten (10). Further, as previously mentioned, the resistors 5, 6 and 10 form an input resistive attenuating network for the A.C. signals appearing on terminal 8, and the relative magnitudes of these resistors are so proportioned to provide or reduce the A.C. input signals appearing at terminal 10 by a factor of ten (10). Accordingly, the logic circuit operates as a unity gain device during the signal passing condition, as will be more readily apparent hereinafter.

Let us assume that the logic circuit is in the normal signal passing or transmission mode of operation whereby an assertion function or a true indication is being produced at output terminal 15 by the gate. Under this condition, both the source of positive D.C. potential and the source of A.C. signals are simultaneously applied to input terminals 7 and 8, respectively. Since as previously mentioned, the attenuating factor of the attenuating network is equal to the gain factor of the amplifier, the output signals produced at output terminal 15 are substantially of the same magnitude as the A.C. signals appearing on terminal 8. However, since the amplifier is arranged as a common-emitter configuration, the A.C. output signals are phase shifted 180° with respect to the A.C. input signal. Further, since the transistor is operating linearly or, in other words, the gating circuit operates as a class A amplifier, no distortion occurs in the output signal, and accordingly, the output signals will be a repeat or a reproduction of the input signals with the exception of the phase shift. Thus, this generation of A.C. signals at output terminal 15 will denote an assertion or, in other words, the logical function that will represent the least restrictive of the two output conditions.

The following is an analysis of the operation of the logic circuit during periods when both inputs are not simultaneously applied to terminals 7 and 8. Let us assume that the source of positive D.C. potential is not applied to input terminal 7, but that the source of A.C. signals is connected to input terminal 8. With the absence of the D.C. source from terminal 7, it is readily noted that no supply potential is available at collector electrode 3 and no supply voltage is available for establishing the biasing requirements of the transistor. Obviously, under such a condition the gain characteristics of the amplifier are destroyed and the transistors cannot amplify the A.C. input signals. Further, since the attenuating network is effective in normal reducing any A.C. input signals appearing on terminal 8 by a factor of ten (10), and no gain is available for overcoming this reduction in the input signal level only ambient noise appears on terminal 15. In the condition where A.C. input signals are not applied to input terminal 8, it is readily apparent that the logic circuit remains in a quiescent state or condition, and no reproduced A.C. signals are available at output terminal 15 regardless of whether the D.C. source is present or absent from terminal 7.

Clearly, in each of these operational conditions; namely, only an input present on terminal 7, only an input present on terminal 8, or no input present on either 7 or 8, no A.C. output signals are produced on terminal 15 so that this operative condition may be defined as the other logical function, namely, the negation or the most restrictive condition.

It may now be observed that A.C. signals are only generated at output terminal 15 when both the D.C. and A.C. input signals are applied to both terminals 7 and 8.

In further analyzing, it will be observed that neither a short-circuited nor an open-circuited condition of transistor 1 will produce or permit an assertion to exist on terminal 15, that is, cause A.C. output signals to be generated which may be indicative of the least restrictive condition. For example, a shorted transistor causes the loss of the necessary gain for overcoming the A.C. signal reduction caused by the resistive attenuating network so that an assertion is not available at output terminal 15. Similarly, an open-circuited condition destroys the amplification characteristics of transistor 1 so that the necessary gain for overcoming the attenuation factor is no longer present thereby resulting in no A.C. output signals being available at terminal 15. Further, it is noted that the opening of the resistors, capacitors, or the interconnecting leads either results in the loss of the required gain, the necessary bias, or the input signals for producing A.C. output signals on terminal 15. In a like manner, the short-circuiting of the resistors 5, 6, 14 or 12 destroys the amplifying characteristics of transistor 1 by either shorting the A.C. input signals to ground or causing the transistor to become heavily saturated which again prevents an assertion signal from being available on output terminal 15. Similarly, the shorting of capacitor 13 drives the transistor 1 into heavy saturation so that an assertion is not possible during such a malfunction. Since as previously mentioned resistors 10 and 11 are constructed of metal film, the chance of these resistors shorting is highly improbable, if not impossible.

The shorting of capacitor 9 is not necessarily a critical condition since A.C. input signals can only be produced on the output terminal 15 when both the D.C. and A.C.

signals are present on terminals 7 and 8. Since under such condition a logical assertion is desired and is being produced, the circuit operates normally and remains fail-safe even with a shorted capacitor 9.

Thus, it can be seen that failures of either the active or passive elements are incapable of producing an erroneous or false indication, and therefore, the circuit is fail-safe. That is, under no circumstance, other than during the normal mode of operation is an assertion or the least restrictive condition produced.

Further, it is noted that critical component failures can be readily ascertained since an assertion cannot be produced during such abnormal operation conditions.

Although a P type or N-P-N transistor has been illustrated, it is to be understood that transistors of opposite conductivity, that is, N type or P-N-P transistors may be used in the circuit with merely a reversal of the supply potential as is well known. Similarly, while the present invention has been described in connection with a common-emitter configuration, it is readily apparent that other configurations; namely, a common-base or a common-collector amplifier may also be employed with merely a rearrangement of the inputs and outputs as is readily known to those skilled in the art.

It will also be appreciated that while this invention finds particular utility in speed control systems, it is readily evident that the invention is not merely limited thereto but may be employed in various systems and apparatus wherein similar conditions exist without departing from the spirit and scope of this invention.

It will also be apparent that other modifications and changes can be made in the presently described invention, and therefore, it is to be understood that all changes, equivalents and modifications within the spirit and scope of the present invention are herein meant to be included in the appended claims.

Having thus described our invention, what we claim is:

1. A fail-safe signal passing gate comprising an A.C. amplifier having first and second input terminals and an output terminal and including a semiconductive device, first means connecting said first input terminal to said semiconductive device for attenuating A.C. signals which are applied to said first input terminal, second means connecting said second input terminal to said semiconductive device for biasing said amplifier for linear operation when a D.C. input is applied to said second input terminal, and said gate normally operating as a unity gain device when both said D.C. and A.C. inputs are applied to said first and second input terminals for producing an A.C. output on said output terminal.

2. A fail-safe signal passing gate comprising an A.C. amplifier having first and second input terminals and an output terminal and including a transistor, first means connecting said first input terminal to said transistor for attenuating A.C. signals appearing on said first input terminal, second means connecting said second input terminal to said transistor for biasing said amplifier for linear operation when a D.C. input is applied to said second input terminal, and said gate normally producing an A.C. output on said output terminal when both said D.C. and A.C. inputs are present on said first and second input terminals and said first and said second means are performing their attenuating and biasing functions.

3. A fail-safe logic circuit comprising an A.C. amplifier having a pair of input terminals and an output terminal, means connected to one of said pair of input terminals for biasing said amplifier for linear operation, means connected to the other of said pair of input terminals for producing an attenuating factor for overcoming the gain factor of said amplifier, and means connected to said output terminal for providing a logical assertion output only during the presence of input signals on said pair of input terminals, and for providing a logical negation output during the absence of input signals from either of said input terminals.

4. A fail-safe gate circuit comprising an amplifying device having a predetermined gain factor and having a pair of inputs and an output, biasing means interconnecting one of said pair of inputs to said amplifying device whereby said amplifying device operates linearly, attenuating means interconnecting the other of said pair of inputs to said amplifying device for providing an attenuation factor substantially equal to said gain factor of said amplifying device, so that said amplifying device is only rendered conductive for producing output signals during the presence of input signals on both of said pair of inputs.

5. A fail-safe logic circuit comprising a transistor amplifier having a predetermined gain and having an emitter, a collector and a base electrode, a direct current input terminal, an alternating current input terminal, an output terminal, a series connected first capacitor and first resistor connecting said alternating current input terminal to said base electrode, a second resistor connecting said direct current input terminal to said base electrode, a third resistor connecting said base electrode to ground, said first capacitor and said first resistor along with said second and said third resistors providing an attenuation substantially equal to the amplifier gain, a fourth resistor connecting said collector electrode to said direct current input terminal, a series connected fifth and sixth resistor connecting said emitter electrode to ground, a second capacitor connected in parallel with said sixth resistor, and means connecting said collector electrode to said output terminal whereby the presence of alternating current output signals on said output terminal indicates an assertion logical condition and whereby the absence of alternating current output signals from said output terminal indicates a negation logical condition.

6. A fail-safe gating circuit comprising an A-C amplifier having a predetermined gain factor and having a pair of input terminals and an output terminal, resistor means connected to one of said pair of input terminals for biasing said amplifier for linear operation, resistor means connected to the other of said pair of input terminals for producing an attenuating factor substantially equal to said gain factor of said amplifier, and means connected to said output terminal for providing an assertion output only during the presence of input signals on said pair of input terminals, and for providing a negation output during the absence of input signals from either of said input terminals and during a malfunctional condition.

7. A fail-safe logic circuit comprising an A-C amplifier having a pair of inputs and an output, biasing means interconnecting one of said pair of inputs to said amplifying device for biasing said amplifying device for linear operation, attenuating means interconnecting the other of said pair of inputs to said amplifying device for neutralizing the gain of said amplifying device, so that said amplifying device is only rendered conductive for producing output signals on said output during the presence of input signals on both of said pair of inputs.

8. A fail-safe logic circuit comprising a semiconductive device having an input, a common, and an output electrode, a direct current input terminal, an alternating current input terminal, an output terminal, a series connected first capacitor and first resistor connecting said alternating current input terminal to said input electrode, a second resistor connecting said direct current input terminal to said input electrode, a third resistor connecting said input electrode to ground, a fourth resistor connecting said output electrode to said direct current input terminal, a series connected fifth and sixth resistor connecting said common electrode to ground, a second capacitor connected in parallel with said sixth resistor, and means connecting said output electrode to said output terminal whereby the presence of alternating current output signals on said output terminal indicates the presence of inputs on said direct current and said alternating current input terminals and whereby the absence of alernating current output signals from said output terminal indicates the absence of inputs from at least one of said direct current alternating current input terminals and also is indicative of a malfunction present in the logic circuit.

9. A fail-safe logic circuit for providing output signals indicating a logical assertion only during the presence of a pair of input signals and in the absence of a malfunction therein comprising: an amplifier having a predetermined gain factor, first means electrically connecting one of said pair of input signals to said amplifier for producing class A operation, second means electrically connecting the other of said pair of input signals to said amplifier and providing an attenuating factor substantially equal to said gain factor whereby the output signals indicating a logical assertion are substantially a reproduction of the last-mentioned input signals.

10. A fail-safe logic circuit for producing a logical assertion condition during the presence of a pair of inputs and for producing a logical negation condition during the absence of at least one of the pair of inputs and during a malfunction condition occurring therein comprising: a transistor amplifier having a predetermined gain and having a base, an emitter and a collector electrode, a first capacitor and a first resistor serially connecting one of said pair of inputs to said base electrode, a second resistor connecting the other of said pair of inputs to said base electrode, a third resistor connecting said base electrode to ground, said first capacitor and said first resistor along with said second and said third resistors providing an attenuating factor proportional to the amplifier gain, a fourth resistor connecting the other of said pair of inputs to said collector electrode, a fifth and a sixth resistor serially connecting said emitter electrode to ground, a second capacitor connected in parallel with said sixth resistor, and an output terminal connected to said collector electrode for determining the logical condition of the logic circuit.

11. A fail-safe gate circuit comprising a first and a second input terminal and an output terminal, a transistorized amplifier arranged in a common-emitter configuration and having a preselected signal gain factor, an input impedance network interconnecting the base and emitter electrodes to said first and second input terminals for biasing said amplifier for linear operation and for providing a signal attenuating factor substantially equal to said preselected signal gain factor so that when a source of direct current is applied to said first input terminal and a source of alternating current signals is applied to said input terminals, and when the circuit is operating properly, alternating current signals are present on said output terminal, and when either one of said source of direct current and said source of alternating current are absent from said input terminals, and when the circuit is operating improperly, alternating current signals are absent from said output terminal.

12. A fail-safe logic circuit for producing a first logical function indicating a least restrictive condition and for producing a second logic function indicating a most restrictive condition during normal periods of operation and only capable of producing the second logical function indicating the most restrictive condition during abnormal periods of operation comprising: an A.C. amplifier including a transistor having a base, an emitter and a collector electrode, said amplifier having a predetermined gain factor and arranged in a common-emitter configuration, a D.C. input terminal, an A.C. input terminal, and an output terminal, a voltage divider connected to said D.C. input terminal and ground and having its intermediate point connected to said base electrode for biasing said amplifier for linear operation when a source of D.C. potential is applied to said D.C. input terminal, a capacitor and a series connected resistor connecting said A.C. input terminal to said intermediate point and functioning in conjunction with said voltage divider to provide an attenuating factor substantially equal to said gain factor when a source of A.C. signals is applied to said A.C. input terminal whereby said circuit operates as a unity gain device and functions to produce A.C. output signals on said output terminal which is representative of the first logical function indicating the least restrictive condition.

References Cited

UNITED STATES PATENTS

| | | | |
|---|---|---|---|
| 2,946,957 | 7/1960 | Beter et al. | 307—253 X |
| 2,987,627 | 6/1961 | Eckert | 307—253 |
| 3,153,729 | 10/1964 | Leakey | 307—253 |
| 3,197,709 | 7/1965 | Antonio et al. | 307—253 X |
| 3,201,611 | 8/1965 | Mollinga | 307—253 X |
| 3,259,849 | 7/1966 | Willett et al. | 307—253 X |

OTHER REFERENCES

Hurley: Junction Transistor Electronics, 1958 (pp. 76 and 77, 341 and 342).

ARTHUR GAUSS, *Primary Examiner.*

DONALD D. FORRER, *Assistant Examiner.*

U.S. Cl. X.R.

307—253